United States Patent
Nagao

(10) Patent No.: US 8,320,187 B2
(45) Date of Patent: Nov. 27, 2012

(54) NONVOLATILE SEMICONDUCTOR MEMORY AND CONTROL METHOD THEREOF

(75) Inventor: Osamu Nagao, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/234,628

(22) Filed: Sep. 16, 2011

(65) Prior Publication Data

US 2012/0201077 A1 Aug. 9, 2012

(30) Foreign Application Priority Data

Feb. 9, 2011 (JP) ................................. 2011-026300

(51) Int. Cl.
*G11C 11/34* (2006.01)
(52) U.S. Cl. .......... 365/185.22; 365/189.05; 365/185.28
(58) Field of Classification Search ............. 365/185.22, 365/189.05, 185.28
See application file for complete search history.

(56) References Cited

U.S. PATENT DOCUMENTS

| 6,859,401 B2 | 2/2005 | Hosono et al. |
| 2006/0123295 A1* | 6/2006 | Tanaka ........................... 714/726 |
| 2010/0061148 A1 | 3/2010 | Komatsu |

FOREIGN PATENT DOCUMENTS

JP 2010-67291 3/2010

* cited by examiner

*Primary Examiner* — Jason Lappas
(74) *Attorney, Agent, or Firm* — Oblon, Spivak, McClelland, Maier & Neustadt, L.L.P.

(57) ABSTRACT

According to one embodiment, a nonvolatile semiconductor memory includes memory cells storing data of multi-level, a bit scan circuit to scan the number of to-be-written memory cells and the number of memory cells that have passed the verify, a processing unit to perform an operation process based on a scan result of the bit scan circuit, and a control circuit to control an operation of writing data according to a first mode in which a voltage used for an upper-data writing is calculated during a lower-data writing and a second mode used a voltage based on setting information. The bit scan circuit scans the number of to-be-written memory cells before starting writing and the processing unit compares the number of to-be-written memory cells with a criterion and determines one of the first and second modes for the writing based on a result of comparison.

20 Claims, 9 Drawing Sheets

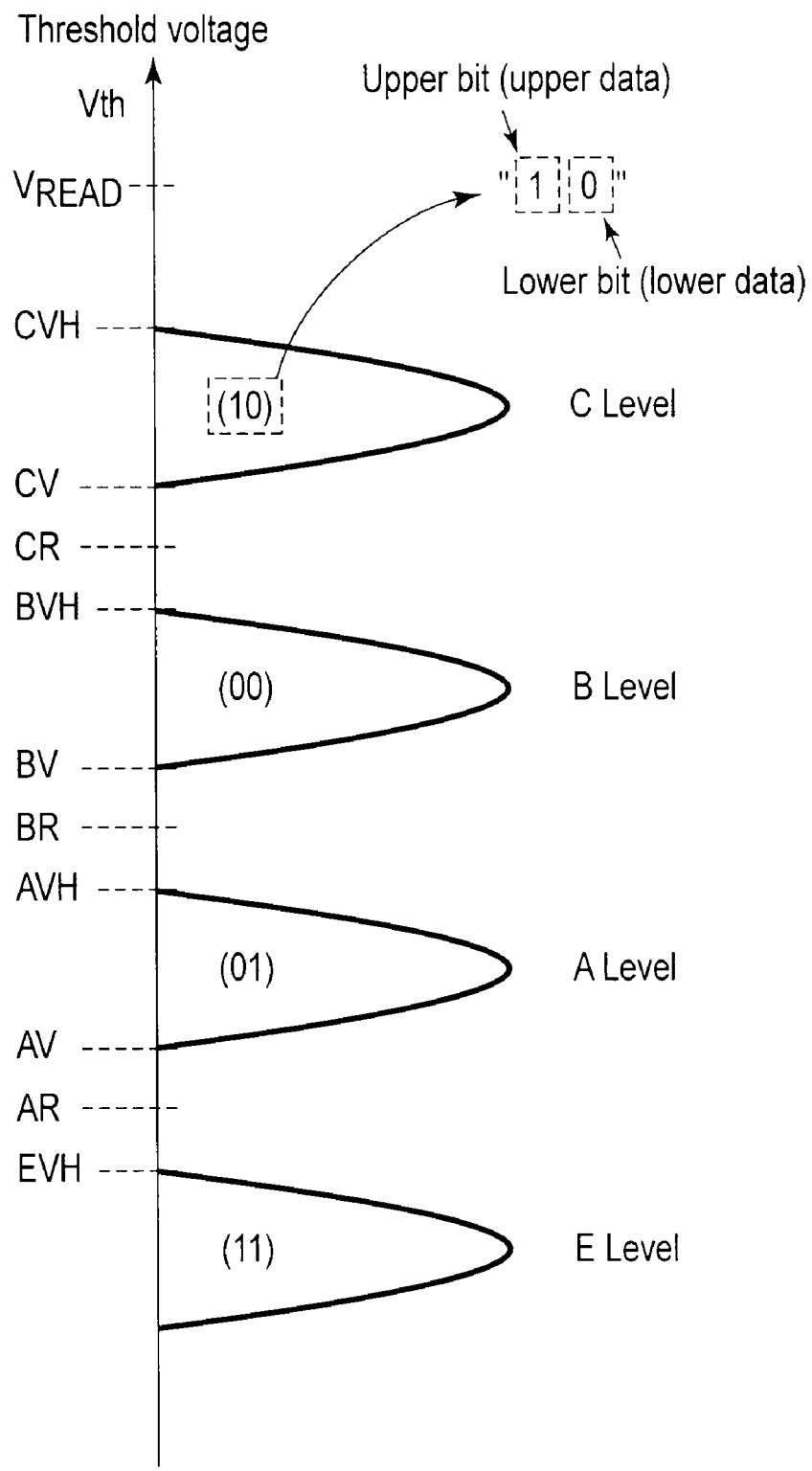
F I G. 3

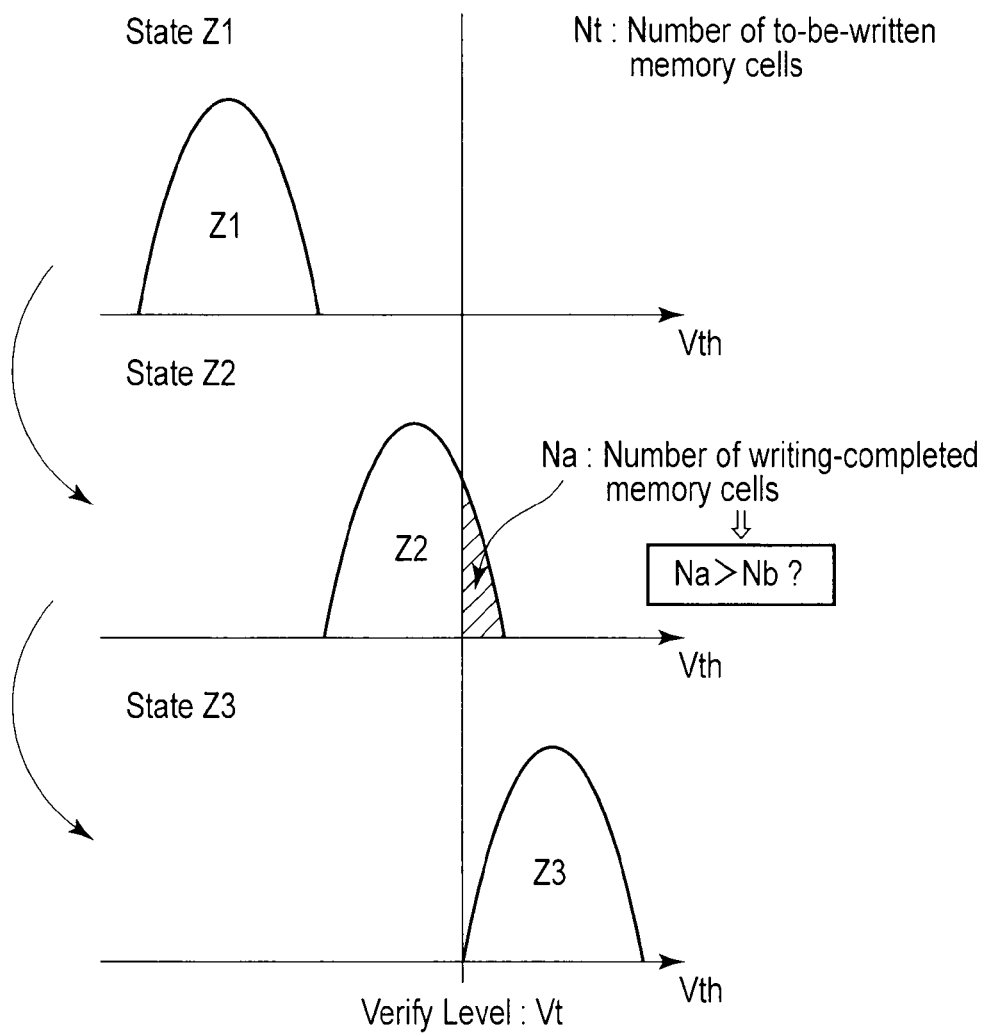
F I G. 6

NONVOLATILE SEMICONDUCTOR MEMORY AND CONTROL METHOD THEREOF

CROSS-REFERENCE TO RELATED APPLICATIONS

This application is based upon and claims the benefit of priority from prior Japanese Patent Application No. 2011-026300, filed Feb. 9, 2011, the entire contents of which are incorporated herein by reference.

FIELD

Embodiments described herein relate generally to a nonvolatile semiconductor memory and a control method thereof.

BACKGROUND

Recently, flash memories are widely used as main storage devices together with HDD, CD/DVD and the like. The memory capacity of the flash memory has been progressively increased by forming data stored in each memory cell in a multi-level form.

The differences between threshold values of a memory cell corresponding to data are more finely controlled in storing multi-level data in the flash memory. As a result, the number of writing operations (the number of applications of a write voltage) in one operation sequence increases and the write time tends to become long.

Therefore, various techniques for suppressing an increase in the write time are proposed for the flash memory while maintaining the reliability thereof.

BRIEF DESCRIPTION OF THE DRAWINGS

FIG. 3 is a diagram showing one example of the correspondence relationship between data items to be stored and threshold voltages of a memory cell.

FIG. 6 is a diagram for illustrating the writing operation of the nonvolatile semiconductor memory of this embodiment.

DETAILED DESCRIPTION

[Embodiment]

There will now be explained a nonvolatile semiconductor memory according to this embodiment in detail with reference to FIG. 1 to FIG. 9. In the following explanation, elements having the same functions and configurations are denoted by the same reference symbols and a repetitive explanation is made only when necessary.

In general, according to one embodiment, a nonvolatile semiconductor memory includes a memory cell array including a plurality of memory cells arranged in rows and columns, the memory cell storing data of multi-level corresponding to a plurality of threshold values; a row control circuit configured to control the rows of the memory cell array; a column control circuit configured to control the columns of the memory cell array; a latch circuit configured to temporarily hold external data and a result of verify; a bit scan circuit configured to scan the number of to-be-written memory cells and the number of memory cells that have passed the verify; a processing unit configured to perform an operation process based on a scan result of the bit scan circuit; and a control circuit configured to control operations of the row and column control circuits to write the external data to the memory cells connected to a selected word line and control an operation of writing the external data according to a first mode in which a first voltage used for an upper-data writing is calculated during a lower-data writing and a second mode in which a write voltage based on setting information is set. The bit scan circuit scans the number of to-be-written memory cells before starting the external data writing and the processing unit compares the number of to-be-written memory cells with a criterion and determines one of the first and second modes in which the writing is performed based on a result of comparison.

(1) Configuration

The configuration and function of a nonvolatile semiconductor memory of this embodiment are explained with reference to FIG. 1 to FIG. 7.

Figure 1:
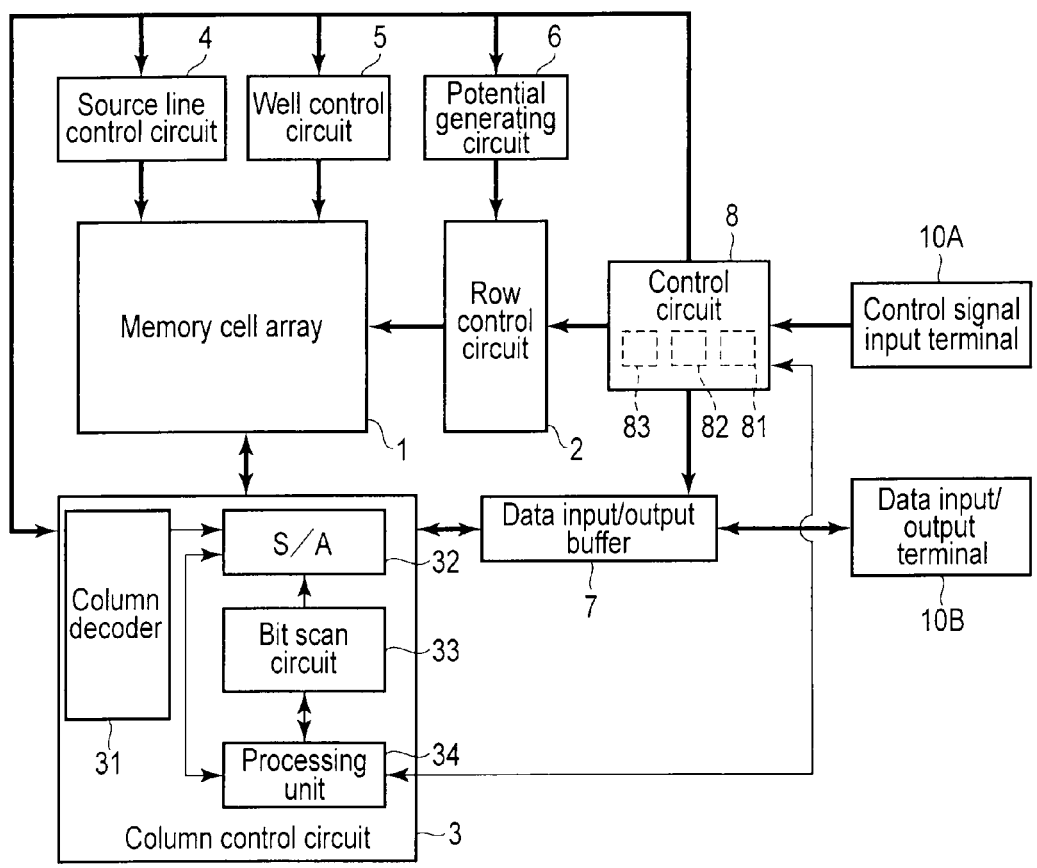
FIG. 1 is a block diagram showing one example of the circuit configuration of a nonvolatile semiconductor memory.

FIG. 1 is a block diagram showing the main portion of the configuration of the nonvolatile semiconductor memory of this embodiment. In the following description, an example of a flash memory is explained as an example of the nonvolatile semiconductor memory.

A memory cell array 1 includes a plurality of memory cells. A plurality of memory cell units MU are formed by plural memory cells.

The internal configuration of the memory cell array 1 of FIG. 1 is explained with reference to FIG. 2.

For example, when the flash memory shown in FIG. 1 is a NAND flash memory, the memory cell array 1 includes a plurality of blocks BLK. Block BLK indicates the minimum unit for erase.

Figure 2:
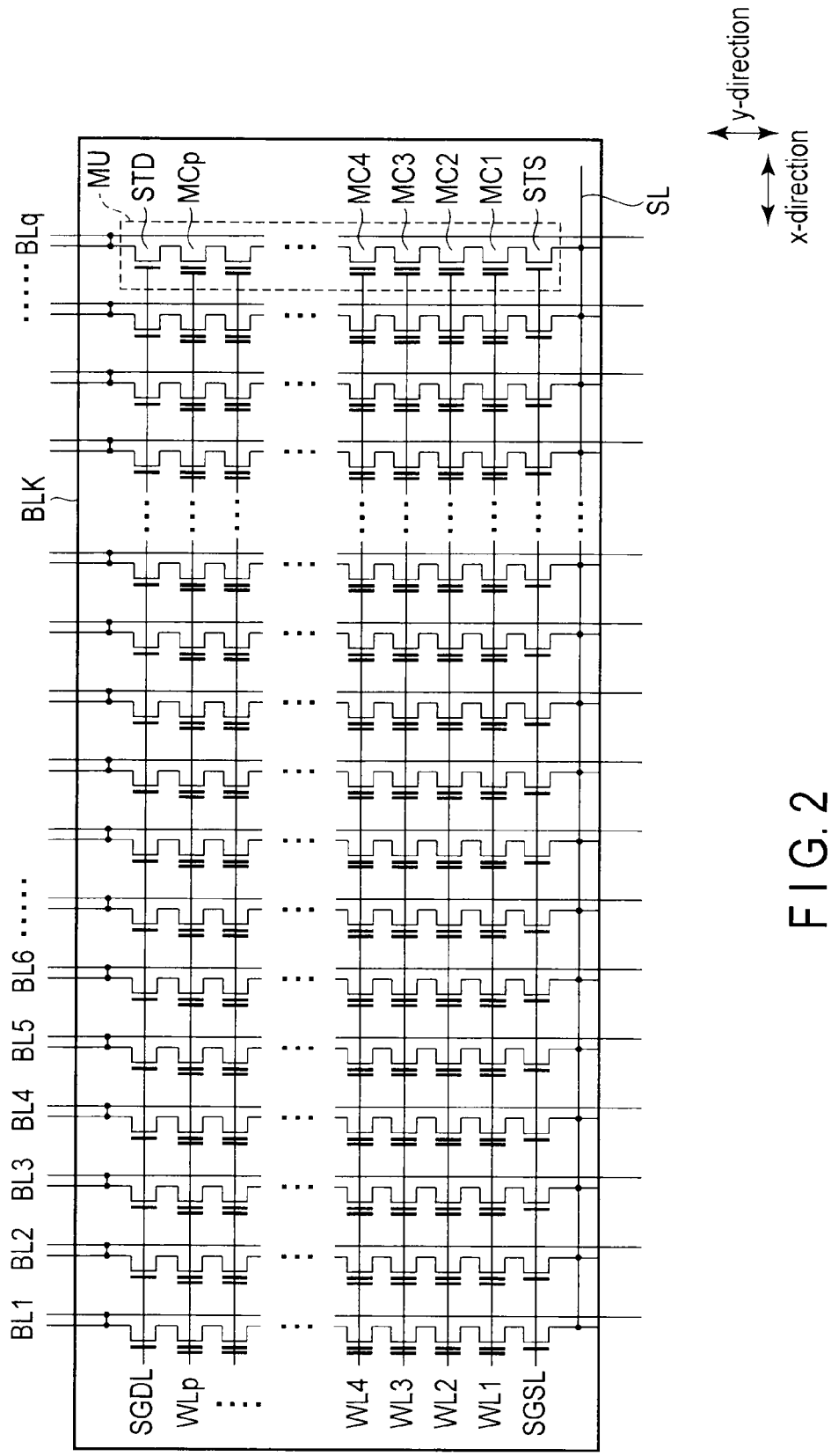
FIG. 2 is an equivalent circuit diagram showing the internal configuration of a memory cell array.

FIG. 2 is an equivalent circuit diagram showing the circuit configuration of one block BLK. Each block BLK is formed by a plurality of memory cell units MU arranged in an x-direction (first direction). In each block BLK, for example, q memory cell units MU are provided.

Each memory cell unit MU includes a memory cell string formed by a plurality of (for example, p) memory cells MC1 to MCp, first select transistor STS (that is hereinafter referred to as a source-side select transistor) connected to one end of the memory cell string, and second select transistor STD (that is hereinafter referred to as a drain-side select transistor) connected to the other end of the memory cell string. In the memory cell string, the current paths of memory cells MC1 to MCp are series-connected in a y-direction (second direction).

Source line SL is connected to one-side ends (on the source side) of memory cell units MU, more specifically, one end of the current path of each source-side select transistor STS. Further, bit lines BL are connected to the other ends (on the drain side) of memory cell units MU, that is, one-side ends of the current paths of drain-side select transistors STD.

The number of memory cells forming one memory cell unit MU may be set to two or more and, for example, it may be set to 16, 32, 64 or more. In the following description, if memory cells MC1 to MCp are not distinguished, they may be represented as memory cell MC.

Memory cell MC is a field-effect transistor with the stacked gate structure including a charge storage layer (for example, a floating gate electrode or an insulating film having a trap level). The source/drain region is connected to two memory cells that are adjacent in the y-direction. Thus, the current paths of memory cells MC are series-connected to form a memory cell string.

One of the source/drain regions of source-side select transistor STS is connected to the source of memory cell MC1. The other source/drain region of source-side select transistor STS is connected to source line SL. One of the source/drain regions of drain-side select transistor STD is connected to the drain of memory cell MCp. The other source/drain region of drain-side select transistor STD is connected to a corresponding one of bit lines BL1 to BLq. The number of bit lines BL1 to BLq is the same as the number of memory cell units MU in block BLK.

Word lines WL1 to WLp extend in the x-direction and each of word lines WL1 to WLp is commonly connected to the gates of a plurality of memory cells MC arranged on a corresponding row in the x-direction. In each memory cell unit MU, the number of word lines is set to the same number (p) of memory cells in one memory cell string.

Drain-side select gate line SGDL extends in the x-direction and is commonly connected to the gates of a plurality of drain-side select transistors STD arranged in the x-direction. Source-side select gate line SGSL extends in the x-direction and is commonly connected to the gates of a plurality of drain-side select transistors STS arranged in the x-direction.

In the following description, if bit lines BL1 to BLq are not distinguished, they may be represented as bit line BL and if word lines WL1 to WLp are not distinguished, they may be represented as word line WL.

FIG. 3 shows one example of the correspondence relationship between data items to be stored in the memory cell and threshold voltages of the memory cell.

FIG. 3 is a graph showing the threshold voltages of memory cell MC, the ordinate indicating threshold voltage (that is also referred to as a threshold voltage level or threshold potential) Vth and the abscissa indicating the probability of existence of memory cells.

As shown in FIG. 3, for example, each memory cell MC can hold four-level data in a four-level flash memory. Specifically, memory cell MC can hold four types of (2-bit) data items of "E" ("Er") level, "A" level, "B" level and "C" level in an order of lower threshold voltage Vth. The "E", "A", "B" and "C" levels respectively correspond to "11", "01", "00" and "10" levels represented in binary notation. As shown in FIG. 3, the bits of each piece of 2-bit data are respectively referred to as the upper bit (or upper data) and lower bit (or lower data). The relationship between the "E" to "C" levels and "00" to "11" data items is not limited to the case of FIG. 3 and can be adequately changed.

The "E" level is an erase level and threshold voltage VthE is set in a range of VthE<AR. Threshold voltage VthA at the "A" level is set in a range of AR<VthA<BR. Threshold voltage VthB at the "B" level is set in a range of BR<VthB<CR. Threshold voltage VthC at the "C" level is set in a range of CR<VthC<$V_{READ}$.

In the present embodiment, a memory cell that stores "C" level data is referred to as a "C" level cell. A memory cell that stores "B" level data is referred to as a "B" level cell. A memory cell that stores "A" level data is referred to as an "A" level cell. Further, a memory cell at the "E" level (erase state) is referred to as an "E" level cell.

Potentials $V_{READ}$, CR, BR and AR are potentials used for data reading based on a read command or for data reading for verify. In this embodiment, data reading performed by using potential (read level) CR as a read level is referred to as "C" reading. "C" reading determines whether the threshold voltage is set at the "C" level or is not higher than the "B" level. Further, data reading performed by using potential BR is referred to as "B" reading. "B" reading determines whether the threshold voltage is set not lower than the "B" level or not higher than the "A" level. In addition, data reading performed by using potential AR is referred to as "A" reading. "A" reading determines whether the threshold voltage is set not lower than the "A" level or set at the "E" level.

Potential $V_{READ}$ is an unselection potential applied to unselected word lines other than a to-be-read word line at the data read time. Potential $V_{READ}$ is set at a level that turns on the memory cell. Therefore, potential $V_{READ}$ is higher than the potential of the threshold voltage distribution corresponding to the most significant data.

After a write voltage (also referred to as a program voltage or write pulse) is applied at the data write time (programming), verify (also referred to as write verify) using a preset criterion is performed.

For example, a low-potential side level in each threshold voltage distribution is used as a potential level that is used as the criterion for verify. However, it is also possible to set a criterion for verify with respect to a high-potential side level of the threshold voltage in addition to the low-potential side level.

In the "C" level threshold voltage distribution, criterion level "CV" (>CR) is set for a low-potential end level of the distribution as a criterion for verify. Criterion level "CVH" (<$V_{READ}$) may be set as a criterion with respect to a high-potential end level of the "C" level distribution. In the "B" level threshold voltage distribution, level "BV" (BVH>BV>BR) is set for a low-potential end level of the distribution as a criterion for verify. Criterion level "BVH" (<CR) may be set as a criterion with respect to a high-potential end level of the "B" level distribution. In the "A" level threshold voltage distribution, criterion level "AV" (AVH>AV>AR) is set for a low-potential end level of the distribution as a criterion for verify. In the "A" level threshold voltage distribution, criterion level "AVH" (<BR) may be set as a criterion with respect to a high-potential end level of the distribution. In the "E" level threshold voltage distribution, high-potential end level "EVH" (<AR) of the distribution is set as a criterion for verify.

Criterion levels CVH, BVH and AVH are respectively referred to as a "CVH" level, "BVH" level and "AVH" level. Further, criterion levels CV, BV and AV are respectively referred to as a "CV" level, "BV" level and "AV" level.

The threshold voltage of the memory cell that has passed verify by using a preset criterion level is shifted in the preset threshold voltage range corresponding to to-be-written data.

Data items are simultaneously written into memory cells MC connected to the same word line WL. Further, data items are simultaneously read from memory cells MC connected to the same word line WL. At this time, data is written or read for each lower bit or for each upper bit. Therefore, when memory cell MC stores 2-bit data, two pages are assigned for each word line WL. In the following description, a page in or from which lower bits are simultaneously written or read is referred to as a lower-bit page and a page in or from which upper bits are simultaneously written or read is referred to as an upper-bit page.

A row control circuit 2 controls the rows of the memory cell array 1. The row control circuit 2 is connected to the word lines and select gate lines provided in the memory cell array 1. The row control circuit 2 includes a row decoder and driver and selects a block and page (word line) based on a row address signal supplied from an address buffer (not shown) to control the operations (potentials) of the word lines and select gate lines.

A column control circuit 3 controls the columns of the memory cell array 1. The column control circuit 3 includes a column decoder 31, sense amplifier circuit 32, bit scan circuit 33 and processing unit 34.

The column decoder 31 selects a column of the memory cell array 1 based on an address signal supplied from an address buffer to drive the sense amplifier circuit 32.

The sense amplifier circuit 32 is connected to the bit lines provided in the memory cell array 1. The sense amplifier circuit 32 senses and amplifies a potential variation of the bit line to determine data stored in the memory cell.

Figure 4:
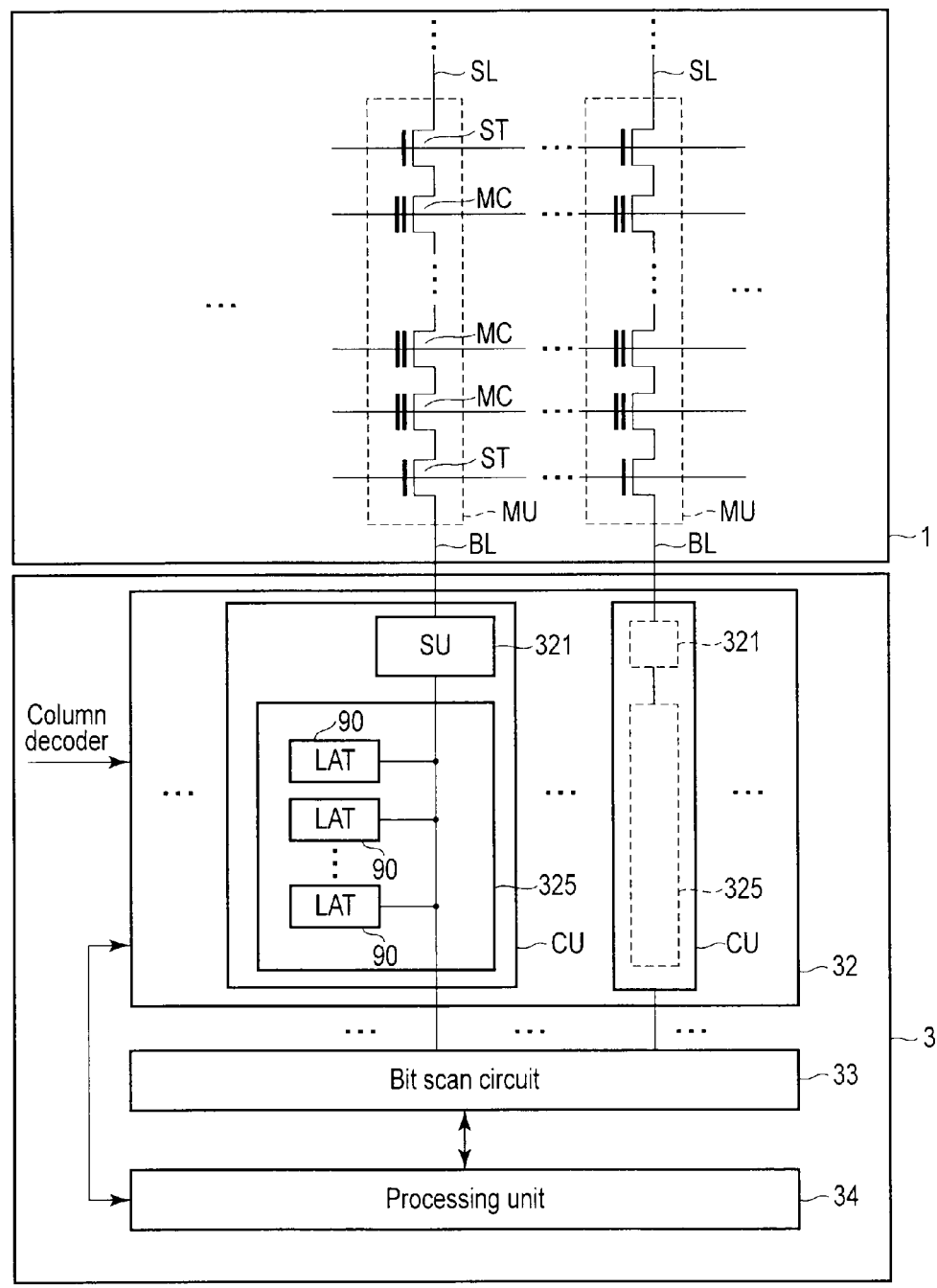
FIG. 4 is a diagram for illustrating the internal configuration of a sense amplifier circuit.

The internal configuration of the sense amplifier circuit 32 is explained with reference to FIG. 4. FIG. 4 schematically shows the internal configuration of the sense amplifier circuit 32.

The sense amplifier circuit 32 includes a plurality of column units CU. Column units CU are provided to respectively correspond to bit lines BL. In this case, two column units may commonly utilize one sense amplifier circuit 32.

Each column unit CU includes a sense unit 321 and latch circuit 325. The sense unit 321 and latch circuit 325 are provided one for each column to correspond to the column of the memory cell array 1. That is, one sense unit 321 and one latch circuit 325 correspond to one bit line BL and memory cell unit MU connected to bit line BL.

One sense unit 321 is connected to one bit line BL. One latch circuit 325 is connected to bit line BL via the sense unit 321.

The sense unit 321 charges and discharges bit line BL under control of the column decoder 31 and control circuit 8 at the data writing. Further, the sense unit 321 senses and amplifies a potential variation of bit line BL to determine data at the data reading.

The latch circuit 325 temporarily stores data to be written in the memory cell, data read from the memory cell and setting information (hereinafter referred to as a flag) indicating the operation of the memory cell. The latch 90 in the latch circuit 325 holds data (data from the exterior) to be written in memory cell unit MU corresponding to the latch circuit 325 at the data writing. Further, the latch (data latch) 90 in the latch circuit 325 holds data (data from the memory cell) read from memory cell unit MU corresponding to the latch circuit 325 at the data reading. One latch 90 holds 1-bit data.

For example, in the multi-level (2-bit or more), a flag held by the latch 90 in the latch circuit 325 is information indicating which level to shift the threshold of the memory cell for to-be-written data.

For example, information indicating completion of writing is held in the latch circuit 325 of column unit CU corresponding to a memory cell (a memory cell that has passed verify) in which a preset data write operation is completed based on the verify result at the verify time. As a result, the operation of continuously writing data in the memory cell in which writing is completed is suppressed.

For example, when one memory cell stores 4-level (2-bit) data, the latch circuit 325 includes one latch 90 that holds the upper bit of the two bits and the other latch 90 that holds the lower bit of the two bits. The latch circuit 325 includes a latch 90 that holds a verify result. However, the verify result (also referred to as verify information) may be written in the latch holding to-be-written data.

In the case of 4-level data, at least two latches holding a to-be-written data and at least one latch holding "0" or "1" of the verify result are provided in the latch circuit 325. But if the bit number of data increases, the number of latches holding data increases. For example, when memory cell MC stores 8-level (3-bit) data, the latch circuit 325 includes three latches holding data. That is, the latch circuit 325 includes a latch that holds one most significant bit, a latch that holds one least significant bit and a latch that holds one bit between the most and least significant bits. Likewise, in the case of 16-level (4-bit) data, the number of latches in the latch circuit 325 becomes four and in the case of 32-level (16-bit) data, the number of data latches in the latch circuit 325 becomes five. The number of latches that holds the verify result may be set to one, two or more according to the specification of the memory.

The bit scan circuit 33 senses the data holding state of the latch circuit 325 in the write sequence of the flash memory.

For example, the bit scan circuit 33 counts the number of memory cells that have passed verify based on the verify result held by the latch circuit 325. The bit scan circuit 33 is a counter, for example. The bit scan circuit 33 may count not only the number of memory cells in which a data write operation is completed but also the number of memory cells in which a data write operation is not yet completed, that is, the number of memory cells in which verify results in failure.

Further, the bit scan circuit 33 of the flash memory of this embodiment counts the number of the memory cells based on data holding states ("1" or "0" states) of the latch of the latch circuit 325.

In the following description, the operation of the bit scan circuit 33 for counting the number of latches set in the data holding state indicating verify pass (or verify fail) is referred to as bit scan.

The processing unit 34 performs an operation process with respect to information (for example, verify result) held by the latch circuit 325 and the result of bit scan of the bit scan circuit 33. The control circuit 8 determines whether adjustment of an application voltage, the write operation or the read operation is proper or not based on the operation result of the processing unit 34. The operation result of the processing unit 34 may be directly supplied to the control circuit 8 or held in the latch circuit 325 of column unit CU.

Further, for example, the bit scan circuit 33 and processing unit 34 refer to data (to-be-written data) supplied from the exterior and held in the latch circuit 325. Then, the bit scan circuit 33 counts the number of to-be-written memory cells (whose threshold voltages are to be shifted) according to data from the exterior or the number of memory cells in which verify and bit scan are performed for the to-be-written data. In the following description, a memory cell that is to be written is referred to as a to-be-written cell and the number of memory cells that are to be written is referred to as the to-be-written cell number (first number) Nt. Further, a memory cell in which writing is completed (that has passed verify) is referred to as a writing-completed cell and the number of memory cells in which writing is completed is referred to as the writing-completed cell number (second number) Na. In addition, a memory cell in which writing is not completed (verify results in failure) is referred to as a writing-incomplete cell and the number of memory cells in which writing is not completed is referred to as the writing-incomplete cell number (third number) Nf.

A source line control circuit 4 controls the potential of the source line connected to the memory cell units. A well control circuit 5 controls the potential of the well region in the memory cell array 1.

A potential generating circuit 6 generates a write voltage, intermediate potential and unselection potential applied to the respective word lines at the data writing (programming), at the data reading and at the erasing. Further, for example, the potential generating circuit 6 also generates potentials applied to the select gate lines. The potentials generated from the potential generating circuit 6 are input to the row control circuit 2 and applied a selected word line, unselected word lines and select gate lines, respectively.

A data input/output buffer 7 acts as a data input/output interface. The data input/output buffer 7 temporarily holds data input thereto from the exterior via a data input/output terminal 10B. The data input/output buffer 7 temporarily holds data output from the memory cell array 1 and outputs held data to the data input/output terminal 10B at a preset timing.

A control circuit 8 manages the whole operation of the flash memory. The control circuit 8 includes a command interface 81 and state machine 82.

The control circuit receives a control signal input from a control signal input terminal 10A. For example, the control signal is output from a chip different from a memory chip, such as a memory controller and host device.

The command interface 81 determines whether data input to the data input/output buffer 7 is command data (command signal) or not. If data input to the data input/output buffer 7 contains command data, the command interface 81 transfers command data to the state machine 82.

The state machine 82 determines the operation mode of the flash memory based on the command data and controls the operations of the respective circuits in the flash memory.

Further, the control circuit 8 includes a setting information storage unit 83. The setting information storage unit 83 holds setting information (setting table) to drive the flash memory. The setting information storage unit 83 stores an initial value of a write voltage, a value added to the write voltage (that is also referred to as a step value) and criterion (reference value) used at the verify time and bit scan time. For example, when setting the above values, a plurality of values are set to be changeable according to the operation of the flash memory, the internal process of the memory cell or the operation result. Setting information may be supplied from a device outside the memory chip, such as the host and memory controller.

The control circuit 8 may have substantially the same functions as those of the bit scan circuit 33 and processing unit 34. Further, the control circuit 8 may refer to data from the exterior to inform the to-be-written cell number to the bit scan circuit 33 and processing unit 34.

Now, the operations and functions of the flash memory of this embodiment at the data write time are explained in more detail with reference to FIG. 5 to FIG. 7.

<Writing of Multi-Level Data>

Writing of multi-level data of the flash memory of this embodiment is explained with reference to FIG. 5. FIG. 5 is a schematic diagram for illustrating the writing operation in the flash memory of this embodiment.

As described above, a multi-level flash memory includes memory cells each of which stores data of two or more bits. In the following description, a case wherein one memory cell stores 2-bit data (upper/lower data) is explained.

The multi-level flash memory has several writing method. In one writing method of the multi-level flash memory, lower data (lower page) is written at the data writing, and after writing of lower data is completed, upper data (upper page) is written following after writing of lower data. In the other writing method of the multi-level flash memory, both of lower and upper data are written at once time. In the present embodiment, as shown FIG. 5, writing of upper data is operated after writing of lower data. In the present embodiment, a lower-data write period in one write sequence is referred to as a first stage and an upper-data write period is referred to as a second stage. The write sequence means the write operation of shifting the threshold voltage of the memory cell to a preset threshold voltage (a threshold voltage corresponding to data).

Figure 5:
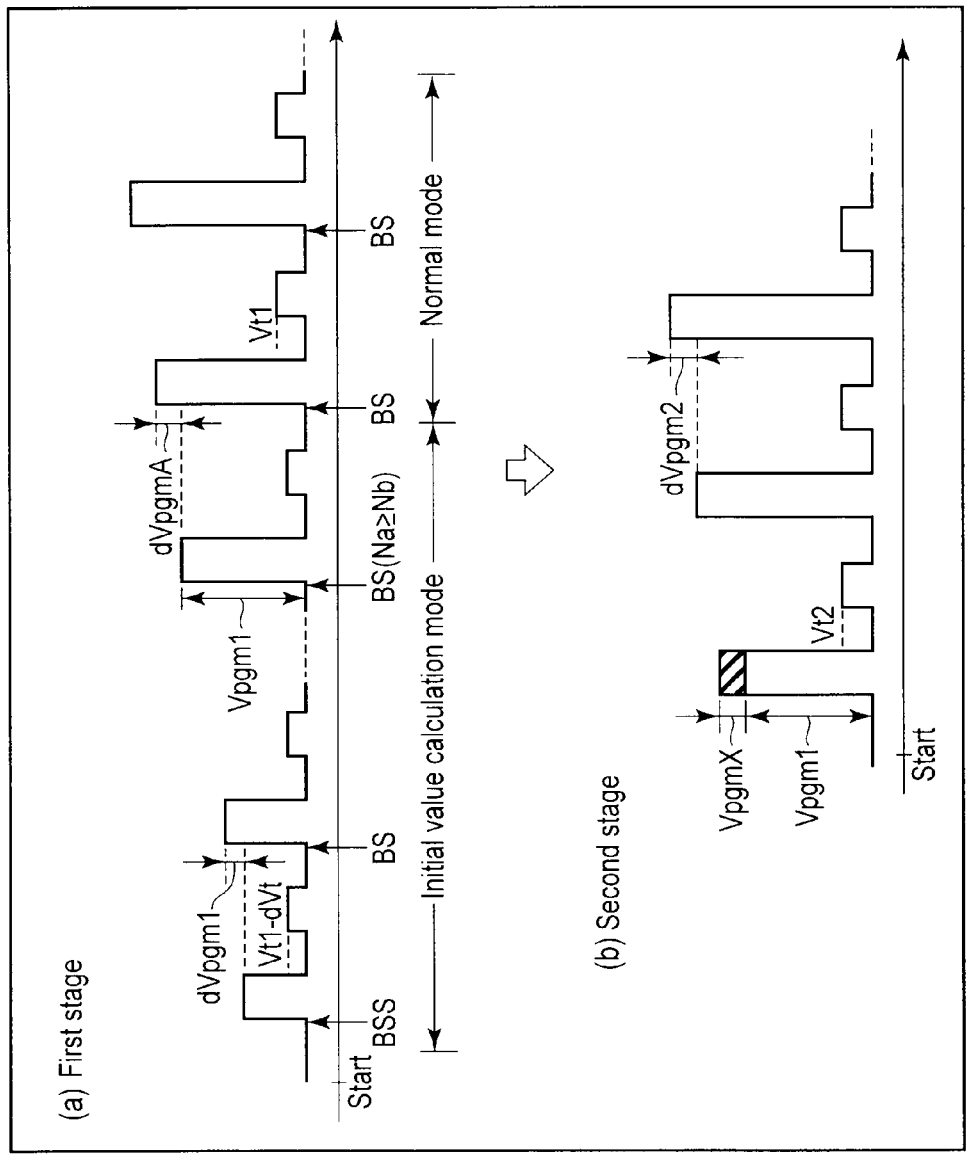
FIG. 5 is a diagram for illustrating the writing operation of a nonvolatile semiconductor memory of this embodiment.

As shown in FIG. 5, a write voltage is applied to a selected word line once or plural times until preset data writing for a selected memory cell (selected cell, to-be-written cell) is completed in the first and second stages.

In order to suppress the threshold voltage of a memory cell in which data writing is unnecessary (also referred to as an unselected cell, "1" data cell or "11" data cell) among the memory cells connected to the selected word line from being shifted, a preset potential is applied to the bit line (unselected bit line) to which the memory cell is connected.

In a period until preset data is written in each stage, a first write voltage applied at the start time of each stage is set as the initial value and a step value is sequentially added to the write voltage applied in the preceding cycle. For example, the period until preset data is written means the period until the threshold voltage of the memory cell is settled in a range of a threshold voltage corresponding to to-be-written data. As a result, the magnitude of the write voltage is changed step by step according to the step value in each stage to continuously write data in the selected cell. If the threshold voltage of a memory cell is shifted to a preset threshold voltage by first application of the write voltage, data writing with respect to the memory cell is terminated.

For example, as the initial value of the write voltage and step value, a value calculated based on the bit scan result or a value held in the setting information storage unit 83 of the control circuit 8 is used according to the operating condition.

In the flash memory of this embodiment, it is possible for one memory cell to store 1-bit data according to a command and data from the exterior.

<Verify>

Verify in the flash memory of this embodiment is explained with reference to FIG. 6.

Verify is performed by using criterion levels (verify levels) such as "CV" to "AV" levels shown in FIG. 3 according to to-be-written data, for example, between an Mth application of a write voltage and an (M+1)th application of a write voltage in the first and second stages. "M" is an integral number larger than 0.

For example, when the criterion levels ("AV" to "CV" levels) on the lower-potential side of the threshold voltage distribution corresponding to data are used, whether data writing with respect to each memory cell is completed or not is determined based on whether the threshold voltage of a memory cell (to-be-written cell) is not lower than a preset verify level corresponding to to-be-written data in data writing.

In FIG. 6, the number of memory cells in which data writing is completed in the to-be-written cell number Nt is 0 in state Z1 set before data writing.

Then, if a write voltage is applied to the selected word line, the threshold voltage of the memory cell is shifted and a memory cell having a threshold voltage equal to or higher than the verify level occurs as shown in state Z2.

The memory cell having a threshold voltage of verify level Vt is a memory cell in which data writing is completed. The memory cell is used as a verify-pass cell. The memory cell having a threshold voltage lower than verify level Vt is a memory cell in which data writing is not yet completed. The memory cell is used as a verify-fail. Thus, since characteristics vary for respective memory cells, verify-pass memory cells and verify-fail memory cells are present on one selected word line (page) even if the write voltage of the same magnitude is applied to to-be-written cells connected to the selected word line.

For example, the verify results (verify information) indicating verify-pass or verify-fail are held in the latch circuit 325 that corresponds to the to-be-written cell.

If the write voltage is gradually increased and preset data writing with respect to a to-be-written memory cell is completed, the threshold voltages of almost all of the to-be-written cells become equal to or higher than the verify level as shown in state Z3.

Verify-pass or verify-fail may be determined according to whether or not the threshold voltage of the memory cell lies between two verify levels (for example, between the "AV" level and the "AVH" level).

<Bit Scan>

The bit scan in the flash memory of this embodiment is explained with reference to FIG. 7. In this example, the bit scan is explained by referring to FIG. 5 and FIG. 6.

Figure 7:
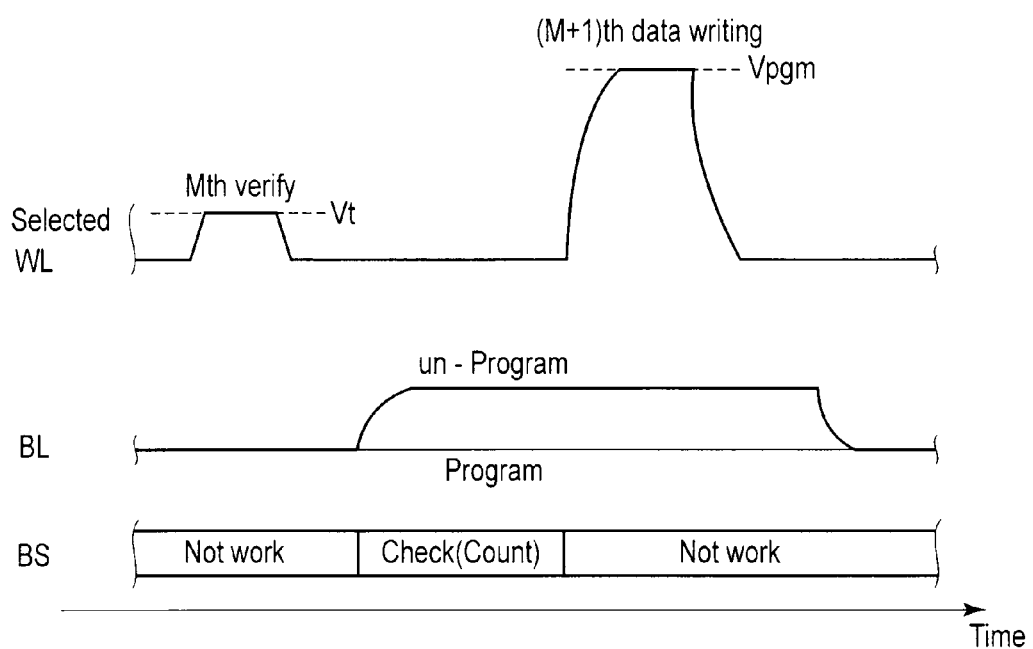
FIG. 7 is a diagram for illustrating the writing operation of the nonvolatile semiconductor memory of this embodiment.

FIG. 7 is a timing chart for illustrating the operation timing of bit scan BS.

Bit scan BS of the verify result by the bit scan circuit 33 is performed during the preparation for data writing; for example, in a period between the Mth verify and (M+1)th application of a write voltage.

As shown in FIG. 7, an unselected bit line is charged to a preset potential before a write voltage is applied to a selected word line.

In this case, the unselected bit line is a bit line connected to memory cells in which data writing is completed or a bit line connected to memory cells in which data writing is unnecessary. The channel potential of the memory cell whose threshold voltage is not required to be shifted rises by charging the unselected bit line and tunneling of electrons via the tunnel insulating film with respect to the memory cell is suppressed.

Bit scan BS is performed before a write voltage is applied to the selected word line. Likewise, comparison of memory cell number Na with preset criterion Nb1 by the processing unit 34, described later, is made before the write voltage is applied to the selected word line. This is performed to reflect the result on a next write voltage. Bit scan BS and determination by the processing unit 34 may be performed at an operation timing suitable for the specification of the flash memory in a period between the Mth verify and (M+1)th application of a write voltage.

Bit scan BS is performed by causing the bit scan circuit 33 to scan (sense) the verify result (pass/fail information) held in the latch circuit 325.

For example, the bit scan circuit 33 scans that the number of memory cells in which data writing is completed is Na based on the data holding state of the latch circuit 325 in state Z2 of FIG. 6. Further, if the to-be-written cell number is "Nt", the bit scan circuit 33 can determine that the number of memory cells now set in a write process (writing-incomplete cells) is (Nt−Na=Nf).

The bit scan circuit 33 confirms the write result by preceding (Mth) application of the write voltage before (M+1)th application of the write voltage by a bit scan BS. For example, the processing unit 34 performs an operation process based on the Mth verify result or the result of bit scan BS. Further, the control circuit 8 selects a value suitable for the (M+1)th write voltage from the setting information or calculates an adequate value based on the operation result.

Thus, a write voltage suitable for next (M+1)th writing is generated based on the preceding (Mth) write result (verify pass/fail). As a result, the write time can be reduced and the operation of the flash memory can be controlled to complete data writing within a preset cycle.

Further, in the present embodiment, bit scan BSS for counting the number of to-be-written cells is performed before first application of a write voltage in lower-data writing (first stage).

In the following description, an operation cycle formed by a write voltage application (data writing), verify after the write voltage application and bit scan for the verify is referred to as a write loop. Further, the number of write loops is referred to as the write loop number.

By taking the permissible bit number for error correction by ECC (Error Checking and Correcting) into consideration, data writing with respect to a page or block may be terminated even though the threshold voltages of all of the to-be-written cells are not set higher than a preset verify level. This reason is that determination of normally completion of the data writing can be obtained even if the threshold voltage of a memory cell does not correspond to data in a case where write defects can be relieved by ECC. The above determination can be made by using the writing-incomplete cell number Nf by bit scan BS.

<Write Mode>

The flash memory of this embodiment has a plurality of write modes applied to the write operation. The flash memory of this embodiment has a mode in which initial value Vpgm1 of a write voltage used for upper data writing is derived during the lower-data writing as one of the write modes.

In the above write mode, the number Na of memory cells determined to be writing-completed (that is, verify pass) at the verify time and preset criterion (first criterion) Nb1 are compared with each other by means of the processing unit 34 or control circuit 8.

As described above, writing-completed cell number Na is counted by the bit scan circuit 33. Criterion Nb1 is a value set for the verify level of a preset threshold voltage (data) and, for example, is held in the setting information storage unit 83 as one of the setting information items.

The voltage value of the write voltage when writing-completed cell number Na exceeds criterion Nb1 is determined as an initial value of an upper-data write voltage by means of the processing unit 34 or control circuit 8. For example, the initial value is stored in the processing unit 34 or control circuit 8.

In the present embodiment, the write mode in which lower-data writing is performed while calculating voltage value Vpgm1 suitably used for the initial value of the upper-data write voltage is referred to as an initial value calculation mode.

When initial value Vpgm1 suitably used for upper-data writing is calculated in the initial value calculation mode, upper-data writing is performed by using a write voltage based on initial value Vpgm1 obtained after lower-data writing. For example, as shown in FIG. 5, write voltage (Vpgm1+dVpgmX) obtained by adding correction value (step value) dVpgmX to initial value Vpgm1 is used as a first write voltage for upper-data writing in the second stage. Further, as the correction value, not only a positive value but also a negative value can properly be used. Therefore, a voltage lower than the preceding write voltage can be applied to the selected word line as a next write voltage.

In this embodiment, the write mode in which value Vpgm1 obtained in the initial value calculation mode is used as the initial value of the write voltage in the second stage is referred to as a suitable value mode (third mode). In the suitable value mode, the write loop is performed until data writing with respect to a preset number of to-be-written cells is completed.

Thus, data writing can be performed by deriving a write voltage suitable for upper-data writing in the initial value calculation mode and suitable value mode and applying a write voltage suitable for each word line. As a result, the write time of the flash memory can be reduced.

When writing-completed cell number Na becomes equal to or larger than preset criterion (second criterion) Nb2 in the first stage or when an initial value for the second stage is obtained (in the case of Na≧Nb1), only external data writing is performed without calculating an initial value in data writing after this.

For example, if memory cell number Na does not exceed criteria Nb1, Nb2 in the preset write loop number, the control circuit 8 terminates the initial value calculation mode and performs external data writing in the first stage without calculating initial value Vpgm1. If adequate initial value Vpgm1 cannot be calculated in the initial value calculation mode, upper-data writing may be performed by using an initial value of a write voltage held as setting information.

Further, lower-data writing may be performed by using a write voltage held as setting information without using the initial value calculation mode.

In this embodiment, the write mode in which the initial values are not calculated or the write mode in which the calculated initial value is not used is referred to as a normal mode or normal write mode. The initial value of the write voltage and step value in the normal mode are held as setting information in the setting information storage unit 83.

In the present embodiment, value Nb1 used to determine the initial value and criterion Nb2 used to shift the mode to the normal mode are set to the same value and criteria Nb1, Nb2 are simply indicated as "Nb". However, two criteria Nb1, Nb2 may be set to different values according to the specification of the flash memory.

For example, as shown in FIG. 5, the verify level in the initial value calculation mode is set by use of a level different from the verify level in the normal mode.

For example, the verify level in the initial value calculation mode is set to a level (potential) lower than the verify level in the normal mode. When the verify level of the first stage in the normal mode is indicated by "Vt1", the verify level in the initial value calculation mode is indicated by "Vt1−dVt". That is, when writing-completed cell number Na with the verify level of "Vt1−dVt" becomes equal to or larger than criterion Nb, initial value Vpgm1 of the write voltage for the second stage (for upper-data writing) is determined. Verify correction value dVt is a value previously set according to to-be-written data and held in the setting information storage unit 83, for example. The verify level in the initial value calculation mode and the verify level in the normal mode may be set to the same value.

Further, the magnitude of the first write voltage when data writing is started in the initial value calculation mode is smaller than the magnitude of the first write voltage when data writing is started in the normal mode.

The step value (correction value or added value) used in each operation mode may be a constant value or a value that varies according to the result of bit scan BS.

For example, the magnitude of step value dVpgm1 used in the initial value calculation mode is different from the magnitude of step value dVpgmA used in the normal mode. For example, step value dVpgm1 is smaller than step value dVpgmA. As a result, initial value Vpgm1 of the write voltage for the second stage (upper-data writing) can be determined with high precision. Further, the operation speed of data writing in the normal mode can be increased.

In this embodiment, whether lower-data writing is started in the initial value calculation mode or in the normal mode is determined by the bit scan circuit 33 and processing unit 34.

For example, as shown in FIG. 5, the bit scan circuit 33 scans the data holding state of the latch circuit 325 before applying a first write voltage in the first stage (lower-data writing). To-be-written cell number Nt is counted in scan BSS before application of the first writing voltage. The scan operation of counting to-be-written cell number Nt is referred to as bit scan BSS. Then, the processing unit 34 compares to-be-written cell number Nt with criterion Nb. In this case, to-be-written cell number Nt may be compared with criterion (Nb+α) larger than criterion Nb. For example, this is effective when criterion Nb is defined as 80% of writing-completed cell number Na.

Lower-data writing is an operation of shifting the threshold value of the memory cell from the "1" data holding state (erase state) to the "0" data holding state. Therefore, to-be-written cell number Nt can be counted by determining whether or not the lower-data latch 90 is set in a state corresponding to "0" data. That is, the number of data latches 90 corresponding to "0" data writing is counted by the bit scan circuit 33.

For example, when to-be-written cell number Nt is not less than criterion Nb, the lower-data writing is started in the initial value calculation mode.

On the other hand, if to-be-written cell number Nt is less than criterion Nb, the lower-data writing is started in the normal mode without setting the initial value calculation mode.

The control circuit 8 may be configured to have the same functions as those of the bit scan circuit 33 and processing unit 34.

As described above, the flash memory of this embodiment has an operation mode (first write mode, normal mode) in which a preset write voltage is used and an operation mode (second write mode, initial value calculation mode) in which a write voltage used for upper-data writing is calculated in a lower-data write cycle as the operation mode used for data writing.

In this embodiment, for example, the processing unit 34 (or control circuit 8) compares to-be-written memory cell number Nt with criterion Nb before applying the first write voltage to the selected word line in the lower-data writing (first stage). To-be-written cell number Nt is counted by causing the bit scan circuit 33 or control circuit 8 to refer to the data holding state of the data latch (lower-data latch) or externally supplied data.

When to-be-written cell number Nt is less than criterion Nb, the control circuit 8 starts lower-data writing in the normal mode. When to-be-written cell number Nt is not less than criterion Nb, the control circuit 8 starts lower-data writing in the initial value calculation mode.

In the conventional flash memory, if to-be-written cell number Nt is less than criterion Nb, an operation failure in which the initial value of a write voltage in the second stage is not determined may occur. And an operation failure in which the operation in the first stage is not terminated due to the operation failure in which the initial value of a write voltage is not determined may occur. Further, when the initial value is not determined in a preset number of write loops, the write time in the first stage may become long even if the initial value calculation process is forcedly terminated. As a result, the time of the whole write sequence may become long.

The flash memory of this embodiment compares to-be-written cell number Nt with criterion Nb at the start time of lower-data writing. Then, if to-be-written cell number Nt is less than criterion Nb, the flash memory performs lower-data writing and upper-data writing (normal mode) by using a write voltage based on setting information without calculating the initial value of the write voltage used for upper-data writing.

As a result, the flash memory of this embodiment can suppress occurrence of an operation failure in which the write voltage used for upper-data writing in the initial value calculation mode is not determined and an operation failure in which the write operation is not terminated. Further, the flash memory of this embodiment can suppress the operation cycle (operation time) of the write sequence from becoming long.

The bit scan circuit 33 may perform bit scan with respect to memory cells of a preset number extracted from a part of the total number of memory cells (or to-be-written cell) included in one page. In this case, for example, some of the memory cells are extracted from all of the memory cells included in one page and the extracted memory cells are used in the initial value calculation mode. A value calculated in the initial value calculation mode with respect to the preset number of extracted memory cells is used as a representative value of initial value Vpgm1 of all of the memory cells included in one page. For example, when a data randomizing process is performed, "1" data items and "0" data items written in all of the memory cells included in one page are almost equally arranged. Therefore, initial value Vpgm1 for one whole page can be calculated by extracting some memory cells from all of the memory cells included in one page and comparing to-be-written cell number Nt with criterion Nb. A process for extracting a part of the memory cells from all of the memory cells included in one page is referred to as a mask process.

Since bit scan is the operation of counting the number of memory cells that are verify-passed cells (or verify-fail cells), the bit scan time becomes long if the number of to-be-counted memory cells increases. Therefore, initial value Vpgm1 can be calculated in a short period by extracting a part of the memory cells from the memory cells subjected to verify by use of the mask process and performing bit scan. As a result, the write operation speed of the flash memory can be increased.

An example in which the 4-level flash memory is used as the flash memory of this embodiment is shown.

However, if the flash memory is a multi-level flash memory having an operation mode in which the initial value of a write voltage used for writing upper data higher than lower data is calculated during the lower-data writing, it is possible to use a flash memory including memory cells each of which holds data such as 8-level (3-bit) data or 16-level (4-bit) data. As the write mode of the flash memory of this embodiment, known write modes such as a QPW (Quick Pass Write) mode and LM (Lower Middle) mode may be adequately combined.

As described above, according to the flash memory of this embodiment, an increase in the time at the data write time can be suppressed.

(2) Operation

The operation of a nonvolatile semiconductor memory (for example, flash memory) of this embodiment is explained with reference to FIG. 8 and FIG. 9. In this case, FIG. 1 to FIG. 7 are properly used to explain the operation of the memory of this embodiment. Further, the write operation of a 4-level flash memory is explained as an example. But it is also possible to use an 8-level (3-bit) or 16-level (4-bit) flash memory.

Figure 8:
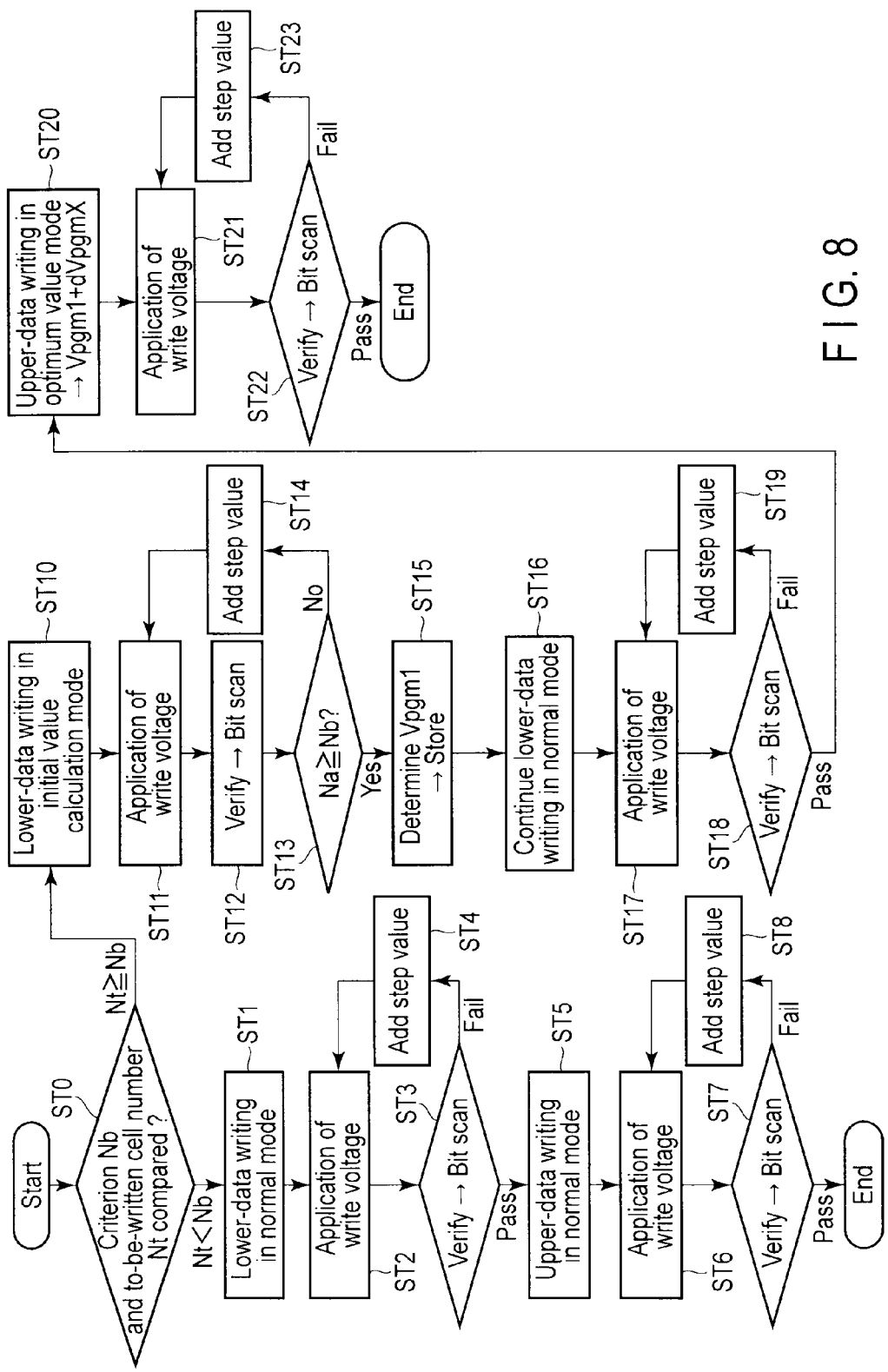
FIG. 8 is a flowchart for illustrating an operation example of the nonvolatile semiconductor memory of this embodiment.

FIG. 8 is a flowchart for illustrating the write operation of the flash memory of this embodiment. FIG. 9 is a schematic diagram for illustrating the write operation of the flash memory of this embodiment.

When a request of data writing is input from the exterior, a write command is input to the control circuit 8 from the exterior via the control signal input terminal 10A. Data from the exterior is input to the data input/output buffer 7 via the data input/output terminal 10B at the same time as inputting of the write command.

If data input to the data input/output buffer 7 is command data, the command interface 81 in the control circuit 8 transfers the command data to the state machine 82.

Further, an address indicating a data-writing object is input to the control circuit 8 and a corresponding row and column of the memory cell array 1 are respectively activated by the row control circuit 2 and column decoder 31.

To-be-written data from the exterior is transferred from the data input/output buffer 7 to the sense amplifier circuit 32 of the column control circuit 3. The thus transferred data is held in the latch circuit 325 corresponding to the column address. At this time, upper data among the transferred data is held in the upper-data latch of the latch circuit 325 and lower data is held in the lower-data latch of the latch circuit 325.

The erase operation is performed with respect to the selected block before data writing. As a result, all of the memory cells in the selected block are set in a "1" (or "11") data holding state. After the erase operation, a soft programming process may be performed to eliminate the excessive erase state of the memory cell. The potential applied to word line WL by soft programming is lower than a write voltage used for data writing. Further, for example, erase verify may be performed after the erase operation.

After the erase operation, in the flash memory of this embodiment, external data writing with respect to the memory cell is started.

In the first stage, lower-data writing is started. Preparation for lower-data writing (first stage) is made based on setting information by the control circuit 8.

As shown in FIG. 8, to-be-written cell number Nt is compared with criterion Nb (Nb1) (step ST0).

To-be-written cell number Nt is derived by bit scan BSS by the bit scan circuit 33 before a first write voltage in the first stage is applied. As shown in FIG. 7, bit scan BSS for determining the operation mode is performed before applying a lower-data write voltage, for example, during a charging period of unselected bit line BL in lower-data writing.

For example, lower-data writing is an operation for shifting the threshold voltage of the memory cell in the erase state ("1" or "11" data holding state) to a threshold voltage corresponding to "0" (or "00") data. Therefore, to-be-written cell number Nt is scanned by causing the bit scan circuit 33 to count the number of lower-data latches in the data holding state corresponding to "0" data at the time of bit scan BSS for determining the operation mode.

To-be-written cell number Nt may be counted by sensing the presence or absence of charging of the bit line or to-be-written cell number Nt may be directly counted based on the number of lower data items of "0" included in to-be-written data.

Further, the number of to-be-written cells included in a preset number of memory cells may be counted, for example, by a mask process without performing bit scan BSS with respect to all of the memory cells (data latches).

To-be-written cell number Nt scanned is transferred to the processing unit 34 and, at the same time, criterion Nb is transferred from the control circuit 8 to the processing unit 34. The processing unit 34 compares to-be-written cell number Nt with criterion Nb. Then, for example, the processing unit 34 notifies the comparison result to the control circuit 8.

When to-be-written cell number Nt is less than criterion Nb, the control circuit 8 or processing unit 34 controls the whole operation of the flash memory to start lower-data writing (first stage) in the normal mode (step ST1).

When to-be-written cell number Nt is not less than criterion Nb, the control circuit 8 or processing unit 34 controls the whole operation of the flash memory to start lower-data writing in the initial value calculation mode (step ST10).

For example, a flag indicating the normal mode or a flag indicating the initial value calculation mode is output from the control circuit 8 according to the result of comparison between to-be-written cell number Nt and criterion Nb and stored in the latch circuit 325.

The control circuit 8 may have substantially the same functions as those of the bit scan circuit 33 and processing unit 34.

Figure 9:
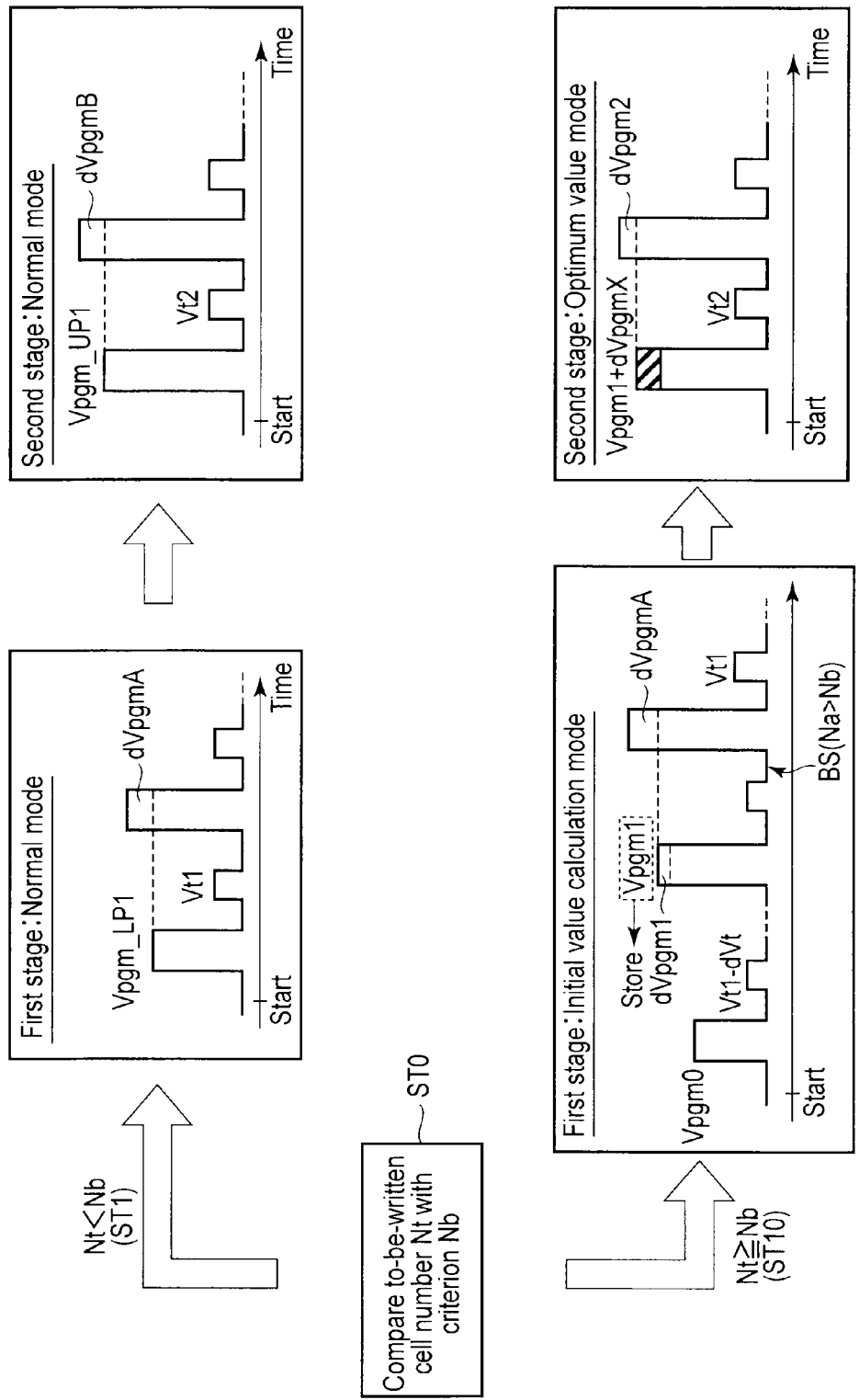
FIG. 9 is a schematic diagram for illustrating the operation of the nonvolatile semiconductor memory of this embodiment.

As shown in FIG. 8 and FIG. 9, when lower-data writing (first stage) in the normal mode is started (in step ST1), write voltage Vpgm_LP1 based on setting information is applied to a selected word line (word line WL1) after charging unselected bit line BL as a first write voltage in lower-data writing (step ST2).

After application of write voltage Vpgm_LP1, a bit line potential is sensed by the sense unit 321 by internal data reading and verify (write verify) with verify level Vt1 used as a criterion level (step ST3). The verify result is held in, for example, the latch circuit 325. The bit scan circuit 33 counts the number Na of verify-passed memory cells (writing-completed cells) by bit scan BS based on the verify result held in the latch circuit 325. As shown in FIG. 7, bit scan BS at the verify time is performed before application of a next write voltage. In this case, bit scan BS may count writing-incomplete cell number Nf.

When data writing for all of the to-be-written cells is not yet completed or writing-incomplete cell number Nf is larger than a permissible bit number by ECC, step value (added value) dVpgmA is added to the first (Mth) write voltage to set a second ((M+1)th) write voltage (step ST4). The magnitude of step value dVpgmA may be adequately adjusted each time an (M+1)th write voltage is set by subjecting the result of bit scan BS with respect to application of the Mth write voltage to an operation process by means of the processing unit 34. A number of memory cells specified by a mask process may be scanned without performing bit scan BS for all of the memory cells after verify.

The above write loop is performed until data writing for all of the memory cells is completed or writing-incomplete cell number Nf becomes equal to or less than a permissible bit number.

When all or a preset number of to-be-written cells have verify-passed in the first stage, upper-data writing (second stage) in the normal mode is started (step ST5).

As shown in FIG. 9, when upper-data writing is started in the normal mode, write voltage Vpgm_UP1 based on setting information is applied to the selected word line as a first write voltage in upper-data writing (step ST6).

Then, like the first stage, in the second stage, verify and bit scan (step ST7) and addition of step value dVpgmA (step ST8) are performed.

In the second stage, verify level Vt2 is used as a criterion of verify. The value (potential) of verify level Vt2 is changed according to a criterion level. Step value (correction value) dVpgmB may be different from or the same as Step value dVpgmA.

When data writing for all of the to-be-written cells is completed in the second stage or writing-incomplete cell number Nf becomes equal to or less than a preset number, external data writing is terminated.

If a preset number of memory cells have not verify-passed in a preset number of write loops in the first and second stages, a block or page different from that indicated by an input address may be selected and lower-data writing and upper-data writing may be performed again.

When the initial value calculation mode is used based on the result of comparison between to-be-written cell number Nt and criterion Nb in step ST10 (step ST10), the following operation is performed.

As shown in FIG. 8 and FIG. 9, when lower-data writing (first stage) in the initial value calculation mode is started, write voltage Vpgm0 is applied to the selected word line as a first write voltage in lower-data writing (step ST11).

Verify is performed (step ST12) after application of write voltage Vpgm0. Verify level (Vt1−dVt1) is used in the initial value calculation mode. For example, verify level (Vt1−dVt1) in the initial value calculation mode is lower than verify level Vt1 in the normal mode.

Then, bit scan BS is performed with respect to the verify result at verify level (Vt1−dVt1) by the bit scan circuit 33. Writing-completed number Na is counted by bit scan BS.

Writing-completed number Na is compared with criterion Nb by the processing unit 34. Whether the initial value of a write voltage used for upper-data writing (stable value mode) is determined or not is determined based on the comparison result (step ST13).

When writing-completed cell number Na is less than criterion Nb, the initial value of an upper-data write voltage is not determined and step value dVpgm1 is added to the preceding (Mth) write voltage (step ST14).

Then, application of the (M+1)th write voltage (step ST11), verify and bit scan (step ST12) and comparison between writing-completed cell number Na and criterion (step ST13) are repeatedly performed until writing-completed cell number Na becomes equal to or larger than criterion Nb.

When writing-completed cell number Na becomes equal to or larger than criterion Nb at a preset verify level (in this example, Vt1−dVt1), value of Mth write voltage Vpgm1 used before verify and bit scan corresponding to the determination result is stored in the processing unit 34 or control circuit 8 as initial value Vpgm1 of the upper-data write voltage (step ST15). For example, write voltage Vpgm1 is expressed by "Vpgm0+(M−1)×dVpgm1" (M≧1) if step value dVpgm1 is constant. Thus, the initial value of the write voltage for upper-data writing is determined during the lower-data writing.

As shown in FIG. 9, after writing-completed cell number Na becomes equal to or larger than criterion Nb1, that is, after initial value Vpgm1 of the write voltage in the second stage is determined, the initial value calculation mode is terminated and lower-data writing in the normal mode is performed (step ST16).

Different criteria may be set as criterion Nb1 used to determine an initial value and criterion Nb2 used to determine shifting to the normal mode. When criteria Nb1 and Nb2 are set to different values, data writing is continuously performed in the initial value calculation mode until writing-completed cell number Na becomes equal to or larger than criterion Nb2 after the initial value is determined.

In data writing in the normal mode following after the initial value calculation mode in the first stage, preset step value dVpgmA is added to the preceding write voltage and the thus obtained write voltage is applied to the selected word line (step ST17) based on setting information or operation by the processing unit 34. Further, the verify level is shifted from level (Vt1−dVt1) to level Vt1 by the control circuit 8.

Then, verify using verify level Vt1 and bit scan BS with respect to the verify result (pass/fail) are performed (step ST18). When a preset number of writing-completed cells have not verify-passed, a write loop formed by application of the write voltage in the normal mode (step ST17), verify/bit scan (step ST18) and addition of the step voltage (step ST19) is performed. That is, the above write loop is performed until a data write process for all of the memory cells is completed or writing-incomplete cell number Nf becomes equal to or less than a permissible bit number.

After the first stage (lower-data writing) including the initial value calculation mode is terminated, the second stage (upper-data writing) is performed.

As described above, when to-be-written cell number Nt becomes equal to or larger than criterion Nb and initial value Vpgm1 of the write voltage in the second stage is obtained in the initial value calculation mode, data writing in the second stage is performed by writing in the stable value mode (step ST20).

As shown in FIG. 9, a first write voltage in the stable value mode is set to voltage (Vpgm1+dVpgmX) obtained by adding step value (correction value) dVpgmX to initial value Vpgm1 obtained in the initial value calculation mode by the control circuit 8. Then, in data writing in the stable value mode, first write voltage (Vpgm1+dVpgmX) is applied to a selected word line (for example, word line WL1) (step ST21). It is also possible to start upper-data writing by using initial value Vpgm1 as the first write voltage without adding step value dVpgmX.

After this, in writing in the second stage, verify and bit scan BS with respect to application of the write voltage are performed (step ST22). Like the writing of the second stage in the normal mode, verify level Vt2 corresponding to to-be-written data is used as a criterion level of verify in the stable value mode.

When all of the memory cells or a preset number of memory cells that satisfy the permissible value have not verify-passed, step value dVpgm2 is added to the preceding write voltage (step ST23). In the second stage, step value dVpgm2 may have the same magnitude as step value VpgmX, may be set to a constant value based on setting information or may be a variable value adjusted based on the result of bit scan BS. When data writing for all of the to-be-written cells is completed or writing-incomplete cell number Nf becomes less than a preset number (permissible bit number), external data writing is terminated.

The write operation of the flash memory shown in FIG. 8 and FIG. 9 is sequentially performed for the respective word lines in the block.

When data writing in a preset number of write loops is not completed in the data writing operation of each stage, lower-data and upper-data writing operations may be performed in an order shown in FIG. 8 and FIG. 9 in response to an address different from an externally input address.

Further, when writing-completed cell number Na is kept less than criterion Nb in a preset number of write loops in the initial value calculation mode of the first stage, the initial value calculation mode may be forcedly terminated and lower-data writing may be performed in the normal mode. In this case, upper-data writing is performed in the normal mode. Further, when lower-data writing is completed in the initial value calculation mode, upper-data writing (second stage) may be started without shifting the mode to the normal mode.

As described above, in the write operation of the flash memory of this embodiment, for example, to-be-written memory cell number Nt and preset criterion Nb are compared before a first write voltage is applied to the selected word line at the lower-data write time (first stage).

Then, when to-be-written cell number Nt is less than criterion Nb, lower-data and upper-data writing operations are performed in the normal mode based on setting information. When to-be-written cell number Nt is not less than criterion Nb, lower-data writing is performed while calculating an initial value of an upper-data write voltage in the initial value calculation mode.

As a result, in the write operation of the flash memory of this embodiment, when to-be-written cell number Nt is less than criterion Nb, occurrence of an operation failure in which a write voltage used for upper-data writing is not determined or an operation failure in which the write operation is not terminated can be suppressed. Further, in the write operation of the flash memory of this embodiment, the operation period of the write sequence can be suppressed from becoming long.

As described above, according to the flash memory of this embodiment, an increase in the time at the data write time can be suppressed.

[Others]

In this embodiment, the flash memory is explained as the nonvolatile semiconductor memory, but this embodiment can also be applied to a memory such as an MRAM (Magnetoresistive RAM), ReRAM (Resistive RAM) and PCRAM (Phase Change RAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory comprising:
   a memory cell array including a plurality of memory cells arranged in rows and columns, the memory cell storing data of multi-levels corresponding to a plurality of threshold values,
   a row control circuit configured to control the rows of the memory cell array;
   a column control circuit configured to control the columns of the memory cell array;
   a latch circuit configured to temporarily hold external data and a result of verify;
   a bit scan circuit configured to scan the number of to-be-written memory cells and the number of memory cells that have passed the verify;
   a processing unit configured to perform an operation process based on a scan result of the bit scan circuit; and
   a control circuit configured to control operations of the row and column control circuits to write the external data to the memory cells connected to a selected word line and control an operation of writing the external data according to a first mode in which a first voltage used for an upper-data writing is calculated during a lower-data writing and a second mode in which a write voltage based on setting information is set;

wherein the bit scan circuit scans the number of to-be-written memory cells before starting the external data writing and the processing unit compares the number of to-be-written memory cells with a criterion and determines one of the first and second modes in which the writing is performed based on a result of comparison.

2. The nonvolatile semiconductor memory according to claim 1, wherein the first mode is selected when the number of to-be-written memory cells is not less than the criterion and the second mode is selected when the number of to-be-written memory cells is less than the criterion.

3. The nonvolatile semiconductor memory according to claim 1, wherein a value of a write voltage applied to the selected word line is stored as the first voltage before the verify when the number of memory cells that have passed the verify is not less than the criterion in the verify result in the first mode.

4. The nonvolatile semiconductor memory according to claim 1, wherein the control circuit performs the upper-data writing in a third mode using a write voltage based on the first voltage when the first voltage is obtained.

5. The nonvolatile semiconductor memory according to claim 1, wherein the control circuit performs the upper-data writing in the second mode when the number of to-be-written memory cells is less than the criterion.

6. The nonvolatile semiconductor memory according to claim 1, wherein the control circuit switches a mode of the lower-data writing from the first mode to the second mode when the number of memory cells that have passed the verify becomes not less than the criterion as the verify result in the first mode.

7. The nonvolatile semiconductor memory according to claim 6, wherein the control circuit shifts a verify level in the verify from a first criterion level used in the first mode to a second criterion level used in the second mode when the lower-data writing is switched from the first mode to the second mode.

8. The nonvolatile semiconductor memory according to claim 7, wherein the first criterion level is lower than the second criterion level.

9. The nonvolatile semiconductor memory according to claim 1, wherein the bit scan circuit scans a part of memory cells extracted from the memory cells connected to the selected word line.

10. The nonvolatile semiconductor memory according to claim 1, wherein an initial value of the write voltage in the first mode is less than an initial value of the write voltage in the second mode in the lower-data writing.

11. The nonvolatile semiconductor memory according to claim 1, wherein the write voltage of the first mode is changed step by step by using a first correction value and the write voltage of the second mode is changed step by step by using a second correction value different from the first correction value in the lower-data writing.

12. A control method of a nonvolatile semiconductor memory comprising:

comparing a number of to-be-written memory cells with a preset criterion before a write voltage used for a lower-data writing is applied to a selected word line to which a plurality of memory cells used for storing a lower and an upper data items are connected;

performing the lower-data writing in a first mode in which a first voltage used for an upper-data writing is calculated during the lower-data writing when the number of to-be-written memory cells is not less than the criterion;

performing the upper-data writing by using a write voltage based on the first voltage after the lower-data writing in the first mode; and performing the lower-data writing in a second mode using a write voltage based on setting information when the number of to-be-written memory cells is less than the criterion.

13. The control method of the nonvolatile semiconductor memory according to claim 12, wherein a value of a write voltage applied to the selected word line before the verify is stored when the number of memory cells that have passed verify becomes not less than the criterion during the lower-data writing in the first mode.

14. The control method of the nonvolatile semiconductor memory according to claim 12, wherein the upper-data writing is performed in a third mode using a write voltage based on the first voltage when the first voltage is obtained.

15. The control method of the nonvolatile semiconductor memory according to claim 12, wherein the upper-data writing is performed in the second mode when the number of to-be-written memory cells is less than the criterion.

16. The control method of the nonvolatile semiconductor memory according to claim 12, wherein the lower-data writing is switched from the first mode to the second mode when the number of memory cells that have passed verify becomes not less than the criterion during the lower-data writing in the first mode.

17. The control method of the nonvolatile semiconductor memory according to claim 12, wherein a verify level used for verify for the lower-data writing is shifted from a first criterion level used in the first mode to a second criterion level lower than the first criterion level and used in the second mode when the lower-data writing is switched from the first mode to the second mode.

18. The control method of the nonvolatile semiconductor memory according to claim 12, wherein the number of to-be-written memory cells is scanned by using a preset number of memory cells among the plurality of memory cells connected to the selected word line.

19. The control method of the nonvolatile semiconductor memory according to claim 12, wherein an initial value of the write voltage in the first mode is smaller than an initial value of the write voltage in the second mode in the lower-data writing.

20. The control method of the nonvolatile semiconductor memory according to claim 12, wherein a write voltage of the first mode is changed step by step by using a first correction value and the write voltage of the second mode is changed step by step by using a second correction value different from the first correction value in the lower-data writing.

* * * * *